United States Patent [19]

Okinoshima et al.

[11] Patent Number: 5,272,222

[45] Date of Patent: *Dec. 21, 1993

[54] CURABLE RESIN COMPOSITIONS AND ELECTRONIC PART PROTECTIVE COATINGS

[75] Inventors: Hiroshige Okinoshima, Annaka; Hideto Kato, Takasaki, both of Japan

[73] Assignee: Shin-Etsu Chemical Co., Ltd., Tokyo, Japan

[*] Notice: The portion of the term of this patent subsequent to Dec. 29, 2009 has been disclaimed.

[21] Appl. No.: 889,377

[22] Filed: May 28, 1992

[30] Foreign Application Priority Data

May 29, 1991 [JP] Japan .................. 3-153942

[51] Int. Cl.$^5$ .................. C08L 79/08; C08L 83/04
[52] U.S. Cl. .................. 525/431; 528/43; 528/41; 528/28; 528/39
[58] Field of Search .................. 525/431; 528/43, 41, 528/28

[56] References Cited

U.S. PATENT DOCUMENTS

| | | | |
|---|---|---|---|
| 4,200,724 | 4/1980 | Darns et al. | 528/26 |
| 4,672,099 | 6/1987 | Kunimune et al. | 528/26 |
| 4,970,283 | 11/1990 | Kuninune et al. | 528/26 |
| 5,071,908 | 12/1991 | Kuninune et al. | 524/708 |

FOREIGN PATENT DOCUMENTS

| | | |
|---|---|---|
| 43-27349 | 11/1968 | Japan . |
| 58-32162 | 7/1983 | Japan . |
| 58-32163 | 7/1983 | Japan . |
| 59-07213 | 2/1984 | Japan . |
| 1-126331 | 5/1989 | Japan . |
| 1-126335 | 5/1989 | Japan . |
| 1-29510 | 6/1989 | Japan . |

Primary Examiner—Melvyn I. Marquis
Assistant Examiner—Margaret W. Glass
Attorney, Agent, or Firm—Birch, Stewart, Kolasch & Birch

[57] ABSTRACT

A curable resin composition comprising a mixture or cocondensate of a compound containing imide and alkoxysilyl groups and an organosilane or organopolysiloxane is shelf stable and cures into a film which is improved in heat resistance, mechanical strength, electrical properties, solvent resistance and adhesion to substrates and thus suitable as a protective film on electronic parts.

7 Claims, No Drawings

CURABLE RESIN COMPOSITIONS AND ELECTRONIC PART PROTECTIVE COATINGS

This invention relates to a curable resin composition for forming an insulating protective coating on electronic parts. It also relates to an electronic part protective coating obtained by curing the composition.

BACKGROUND OF THE INVENTION

Polyimide resins having heat resistance and improved electrical and mechanical properties have been utilized as insulating protective coatings for electronic parts. Since most polyimide resins are insoluble in organic solvents, polyimide protective coatings are generally prepared by using a solution of polyamic acid which is a polyimide precursor, and applying the solution to substrates, followed by heat curing. This conventional approach, however, has several problems. For example, the resulting polyimide resin coatings show poor adherence to such substrates as nickel, aluminum, silicon, and silicon oxide film.

For improving the adherence to substrates, Japanese Patent Publication (JP-B) Nos. 27439/1968 and 7213/1984 propose polyimide-siloxane copolymers in which a diamine component, which is a reactant for forming polyimide, is partially replaced by a siloxane-containing diamine. Also, JP-B 32162/1983, 32163/1983, and 29510/1989 disclose a method of mixing or reacting a polyamic acid or polyimide precursor with a silane having an amino group or acid anhydride group. However, the former method had the problem that copolymers with an increased content of siloxane showed poor heat resistance. In the latter method, the polyamic acid solution experienced a substantial loss of shelf stability with an increasing amount of silane added.

In order to overcome these problems, JP-B 32162/1983 proposes a composition comprising a polyamide acid having a reactive silicone compound attached at either end and a polydisiloxane having a hydroxyl group at either end. Also, Japanese Patent Application Kokai (JP-A) Nos. 126331/1989 and 126335/1989 propose oligomers obtained by mixing and reacting acid dianhydride, organic diamine, and reactive silicone compound in a suitable proportion. The composition and oligomers are still poor in shelf stability and difficult to dissolve in solvents in high concentrations. The limited concentration solution leaves difficulty in providing sufficiently thick films after curing.

SUMMARY OF THE INVENTION

An object of the present invention is to provide a new and improved curable resin composition which is shelf stable and can cure to films of quality having improved heat resistance, mechanical strength, electrical properties, solvent resistance, and substrate adherence.

Another object of the invention is to provide a protective coating of quality for electronic parts by curing the composition.

The inventors have found that a siloxane group-containing polyimide series curable resin composition which has eliminated the above-mentioned problems is obtained by blending a mixture or co-condensate of a compound having an imide group and an alkoxysilyl group of the following structural formula (I) and an organosilane or organopolysiloxane of the following molecular formula (II).

Formula (I):

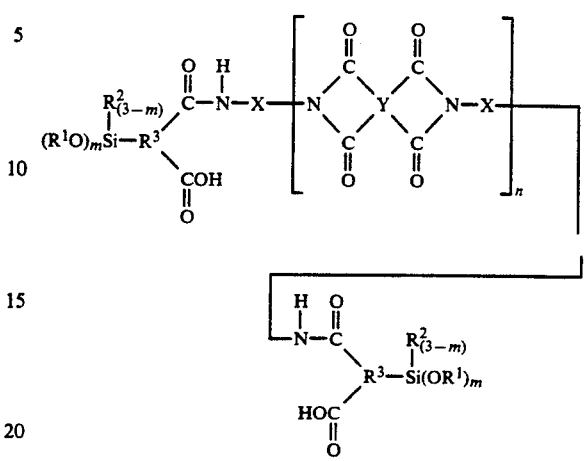

$R^1$ and $R^2$ are independently selected from substituted or unsubstituted monovalent hydrocarbon groups having 1 to 10 carbon atoms, $R^3$ is a trivalent organic group containing an aliphatic or aromatic ring, X is a divalent organic group, Y is a tetravalent organic group containing an aromatic ring, letter m is an integer of from 1 to 3, and n is an integer of at least 1.

$$R^4_a(R^5O)_b SiO_{(4-a-b)/2} \qquad \text{Formula (II)}$$

$R^4$ and $R^5$ are independently selected from a hydrogen atom and substituted or unsubstituted monovalent hydrocarbon groups having 1 to 10 carbon atoms, letters a and b are numbers in the range: $0 \leq a \leq 3$, $0 < b \leq 4$, and $0 < a + b \leq 4$.

The curable resin composition shows excellent shelf stability and can be dissolved in a suitable solvent in high concentrations and thus form a varnish of a widely varying concentration which is easy to apply. On heating, the composition readily cures into films having improved heat resistance, mechanical strength and electrical properties. The cured coatings firmly adhere to the underlying substrates, and they possess not only improved heat resistance, mechanical strength, and electrical properties, but also solvent resistance so that they are useful as protective coatings for electronic parts.

DETAILED DESCRIPTION OF THE INVENTION

The curable resin composition of the present invention is briefly defined as comprising a compound having an imide group and an alkoxysilyl group of structural formula (I) and an organosilane or organopolysiloxane of molecular formula (II).

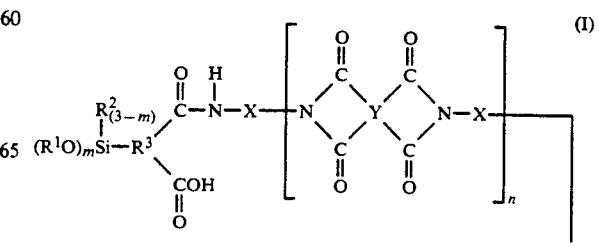

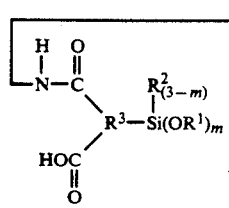

In formula (I), $R^1$ and $R^2$, which may be the same or different, are substituted or unsubstituted monovalent hydrocarbon groups having 1 to 10 carbon atoms, $R^3$ is a trivalent organic group containing an aliphatic or aromatic ring, X is a divalent organic group, Y is a tetravalent organic group containing an aromatic ring, letter m is an integer of from 1 to 3, and n is an integer of at least 1, preferably from 1 to 100 for ease of application and satisfactory adherence.

The compound of formula (I) may be prepared by reacting a polyimide compound of the following structural formula (III) with an aminosilicone compound of the following structural formula (IV) in an organic solvent.

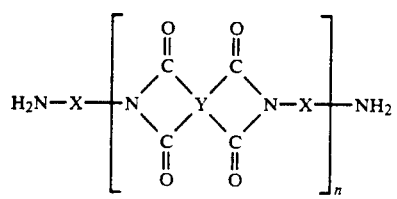

(III)

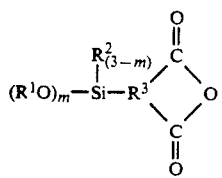

(IV)

In formulae (III) and (IV), $R^1$, $R^2$, $R_3$, X, Y, m and n are as defined above.

The polyimide of formula (III) can be prepared by reacting a tetracarboxylic dianhydride of the following structural formula (V):

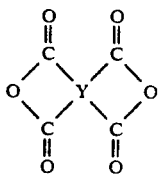

(V)

wherein Y is as defined above with a diamine of the following structural formula (VI):

$H_2N-X-NH_2$ (VI)

wherein X is as defined above in such a proportion that (n+1) molecules of the diamine of formula (VI) are available per n molecules of the tetracarboxylic dianhydride of formula (V) wherein n is an integer of at least 1, thereby forming a polyamic acid of the following structural formula (VII), followed by dehydration in a conventional manner. The reaction scheme is shown below.

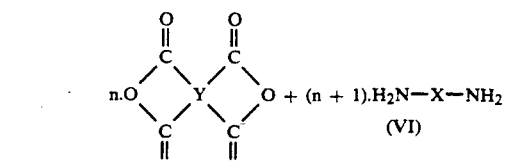

↓

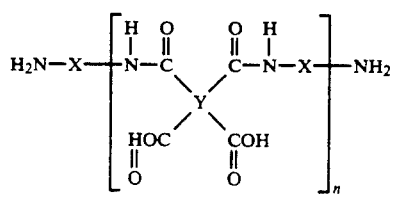

(VII)

↓ $-2n.H_2O$

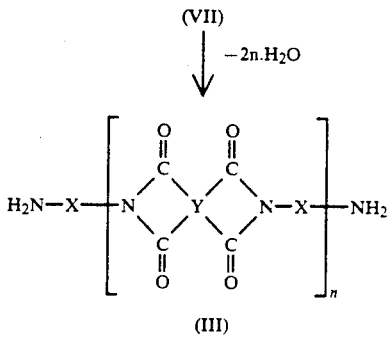

(III)

In the foregoing formulae, Y is a tetravalent organic group having an aromatic ring, which originates from the tetracarboxylic dianhydride of formula (V) which is used as a starting reactant to form the polyimide of formula (III).

The acid dianhydride of formula (V) is often selected from, but not limited to, pyromellitic dianhydride where Y is

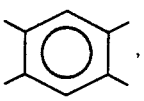

benzophenonetetracarboxylic dianhydride where Y is

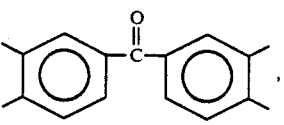

3,3',4,4'-biphenyltetracarboxylic dianhydride where Y is

2,2-bis (3,4'-benzenedicarboxylic anhydride)perfluoropropane where Y is

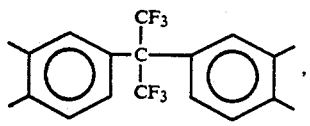

bis (3,4'-dicarboxyphenyl)dimethylsilane dianhydride where Y is

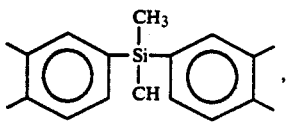

and 1,3-bis (3,4-dicarboxyphenyl)-1,1,3,3-tetramethyldisiloxane dianhydride where Y is

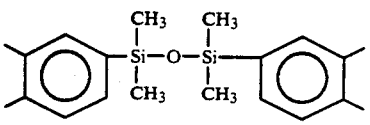

Y may be one or a mixture of the foregoing members. Therefore, when a tetracarboxylic dianhydride of formula (V) is reacted with a diamine of formula (VI) to form a polyamide of formula (III), either a single dianhydride or a mixture of two or more dianhydrides may be used.

In the foregoing formulae, X is a divalent organic group, which originates from the diamine of formula (VI) which is used as a starting reactant to form the polyimide of formula (III). Illustrative, non-limiting examples of Q the diamine of formula (VI) include aromatic ring-containing diamines, for example, p-phenylenediamine,
m-phenylenediamine,
4,4'-diaminodiphenylmethane,
4,4'-diaminodiphenyl ether,
2,2'-bis(4-aminophenyl)propane,
4,4'-diaminodiphenyl sulfone,
4,4'-diaminodiphenyl sulfide,
1,4-bis(3-aminophenoxy)benzene,
1,4-bis(4-aminophenoxy)benzene,
1,4-bis(m-aminophenylsulfonyl)benzene,
1,4-bis(p-aminophenylsulfonyl)benzene,
1,4-bis(m-aminophenylthioether)benzene,
1,4-bis(p-aminophenylthioether)benzene,
2,2-bis[4-(4-aminophenoxy)phenyl]propane,
2,2-bis[3-methyl-4-(4-aminophenoxy)phenyl]propane,
2,2-bis[3-chloro-4-(4-aminophenoxy)phenyl]propane,
1,1-bis[4-(4-aminophenoxy)phenyl]ethane,
1,1-bis[3-methyl-4-(4-aminophenoxy)phenyl]ethane,
1,1-bis[3-chloro-4-(4-aminophenoxy)phenyl]ethane,
1,1-bis[3,5-dimethyl-4-(4-aminophenoxy)phenyl]ethane,
bis[4-(4-aminophenoxy)phenyl]methane,
bis[3-methyl-4-(4-aminophenoxy)phenyl]methane,
bis[3-chloro-4-(4-aminophenoxy)phenyl]methane,
bis[3,5-dimethyl-4-(4-aminophenoxy)phenyl]methane,
bis[4-(4-aminophenoxy)phenyl]sulfone,
etc., and silicone diamines as shown below.

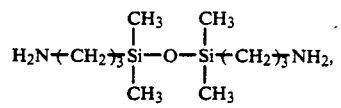

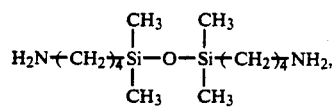

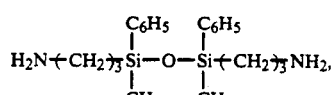

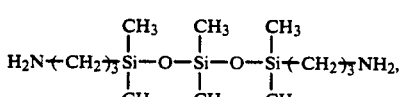

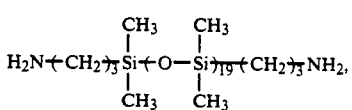

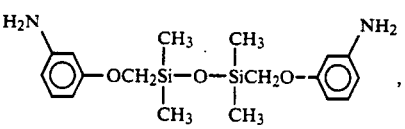

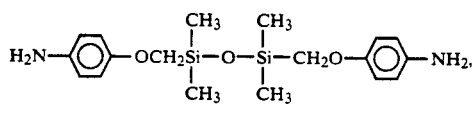

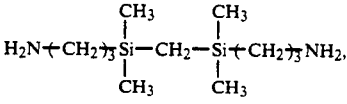

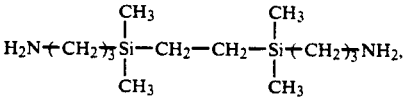

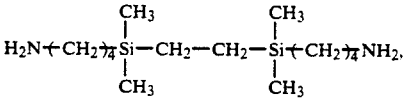

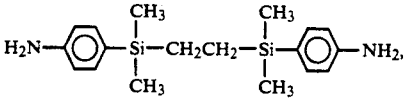

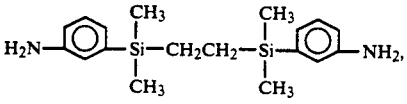

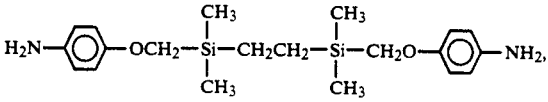

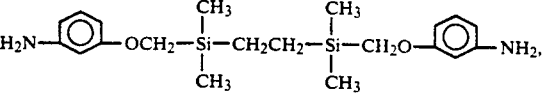

-continued

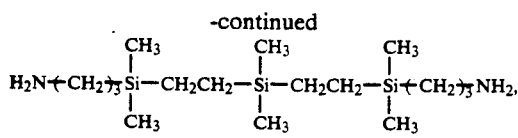

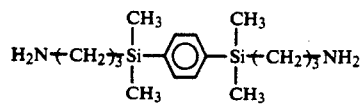

X may be one or a mixture of the foregoing diamine residues. Therefore, either a single diamine or a mixture of two or more diamines may be used in producing the polyimide of formula (III).

The silicone compound to be reacted with the polyimide of formula (III) is of the following structural formula

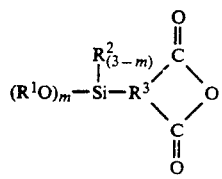
(IV)

In formula (IV), $R^1$ and $R^2$, which may be the same or different, are substituted or unsubstituted monovalent hydrocarbon group having 1 to 10 carbon atoms, preferably 1 to 6 carbon atoms, for example, alkyl groups such as methyl, ethyl, propyl and butyl groups; alkenyl groups such as vinyl, allyl and butenyl groups; aryl groups such as phenyl and tolyl groups; and substituted ones of these groups wherein some or all of the hydrogen atoms attached to carbon atoms are replaced by halogen atoms, cyano groups, and alkoxy groups, for example, chloromethyl, chloropropyl, 3,3,3-trifluoropropyl, 2-cyanoethyl, methoxyethyl, and ethoxyethyl groups. Among these, alkyl groups and alkoxy-substituted alkyl groups are preferred for $R^1$ and substituted or unsubstituted alkyl and aryl groups are preferred for $R^2$.

$R^3$ is a trivalent organic group containing an aliphatic or aromatic ring, more specifically a trivalent substituted or unsubstituted hydrocarbon group containing an aliphatic or aromatic ring, for example, trivalent aliphatic rings such as

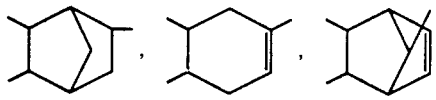

and trivalent aromatic rings having 6 to 20 carbon atoms such as

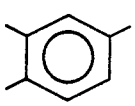

Illustrative, non-limiting examples of the silicone compound of formula (IV) are given below.

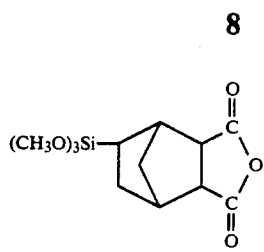

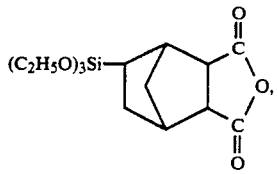

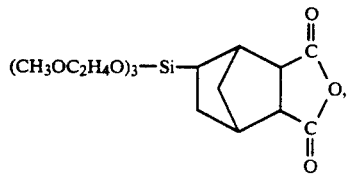

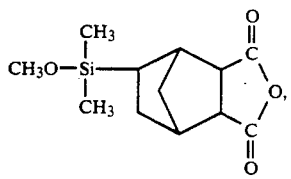

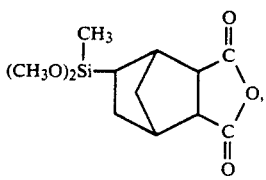

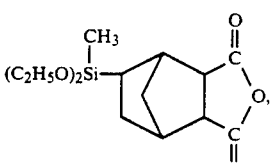

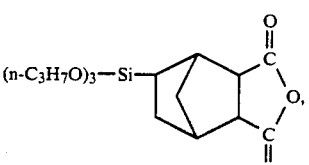

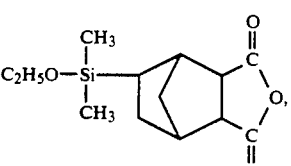

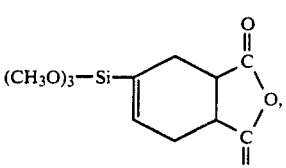

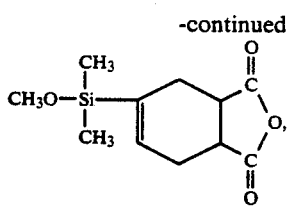

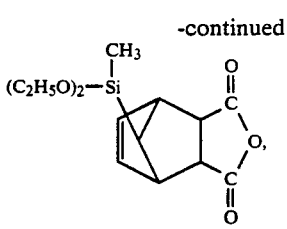

In the practice of the invention, the aminosilicone compounds may be used alone or in admixture of two or more.

Another component contained in the composition of the present invention is an organosilane or organopolysiloxane of the following molecular formula (II).

$$R^4{}_a(R^5O)_b SiO_{(4-a-b)/2} \tag{II}$$

In formula (II), $R^4$ and $R^5$, which may be the same or different, are a hydrogen atom or substituted or unsubstituted monovalent hydrocarbon groups having 1 to 10 carbon atoms, preferably 1 to 6 carbon atoms, for example, alkyl groups such as methyl, ethyl, propyl and butyl groups, alkenyl groups such as vinyl and allyl groups, aryl groups such as phenyl and tolyl groups, and alkoxy-substituted alkyl groups such as methoxyethyl and ethoxyethyl groups.

Letters a and b are numbers in the range: $0 \leq a \leq 3$, $0 < b \leq 4$, and $0 < a+b \leq 4$.

Examples of the organosilane or polysiloxane include compounds of the following structures.

Si $(OCH_3)_4$, Si $(OC_2H_5)_4$, Si $(OC_3H_7)_4$, Si $(CH_3)$ $(OCH_3)_3$,

Si $(C_6H_5)$ $(OCH_3)_3$, Si $(CH_3)$ $(OC_2H_5)_3$, Si $(C_6H_5)$ $(OC_2H_5)_3$,

Si $(CH_3)_2$ $(OCH_3)_2$, Si $(C_6H_5)_2$ $(OCH_3)_2$, Si $(CH_3)_2$ $(OC_2H_5)_2$,

Si $(C_2H_5)_2$ $(OH)_2$, Si $(C_6H_5)$ $(OH)_2$,

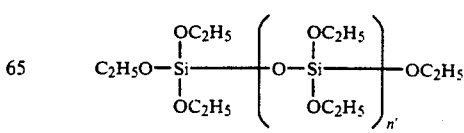

Letter n' is an integer of from 1 to 50.

In one embodiment of the composition according to the present invention, the compound of formula (I) and the organosilane or polysiloxane of formula (II) are blended in any desired proportion. In order that the composition cure into a film having better physical properties, the compound of formula (I) and the organosilane or polysiloxane of formula (II) are blended in a weight ratio (I)/(II) of from 10/1 to ½, especially from 10/1 to 1/1. Often, a blend ratio (I)/(II) in excess of 10 would result in less desirable adherence to substrates whereas a blend ratio (I)/(II) of less than 0.5 would result in less desirable film strength.

An organic solvent is preferably added to the composition of the invention in order to promote mixing of the two components. Examples of the solvent include N-methyl-2-pyrrolidone, dimethylacetamide, dimethylformamide, hexamethylphosphoramide, tetrahydrofuran, 1,4-dioxane, methyl cellosolve, ethyl cellosolve, butyl cellosolve, diglyme (diethylene glycol dimethyl ether), triethylene glycol dimethyl ether, diethylene glycol diethyl ether, acetone, methyl ethyl ketone, methyl isobutyl ketone, cyclopentanone, cyclohexanone, toluene, xylene, methanol, ethanol, and propanol, alone and in admixture of two or more. The amount of the solvent used may be determined in accordance with a particular application.

In another embodiment of the composition according to the present invention, the compound of formula (I) and the organosilane or polysiloxane of formula (II) are condensed by adding an organic solvent to a mixture of the two components and adding an adequate amount of water to the solution, thereby subjecting the two components to cohydrolysis or co-condensation. Water is desirably added in an amount corresponding to ½ or less, especially from ⅓ to 1/5 of the total moles of Si-OR$^1$ in the compound of formula (I) and Si-OR$^4$ in the organosilane or polysiloxane of formula (II). Co-condensation may be carried out in the absence or presence of catalysts, for example, inorganic acids such as hydrochloric acid and sulfuric acid and organic acids such as acetic acid and fluoroacetic acid. The reaction conditions, which need not be particularly limited, generally include a temperature of 0° to 70° C., especially 0° to 40° C. and a time of 4 to 72 hours, especially 12 to 48 hours.

The curable resin composition of the present invention is used in the form of a solution in a suitable solvent when it is desired to apply the composition as protective films on electronic parts. The solvent may be selected from the aforementioned ones alone or in admixture of two or more, independent of whether the composition is based on a mixture or co-condensate of the two components. In order to form cured films of sufficient thickness, the solvent is added such that the concentration of the composition is 10 to 60% by weight, especially 15 to 50% by weight. The thus prepared solution is fully shelf stable.

Cured films are generally obtained from the solution by heating at a temperature of 100° C. to 500° C., preferably 150° C. to 400° C. for about 1 to about 10 hours, whereby the amic acid moiety in structural formula (I) is imidized with attendant formation of water which, in turn, promotes crosslinking reaction of alkoxysilyl groups. As a result, the mixture or co-condensate cures into a high molecular weight polymer having an imide ring which exhibits improved heat resistance, mechanical properties, electrical properties, adherence to substrates, and solvent resistance.

The curable resin compositions of the invention will find a wide variety of applications as coatings or films on various substrates, typically semiconductor devices, for example, passivation films and protective films on semiconductor element surface, protective films over diode and transistor junctions, alpha-radiation shielding films on VLSI, interlayer insulating films, ion implantation masks, conformal coatings on printed circuit boards, orienting films of liquid crystal display elements, glass fiber protective films, and solar battery surface protective films.

There have been described curable resin compositions that are fully shelf stable and that can be cured onto substrates to form coatings having excellent heat resistance, mechanical strength, electrical properties, solvent resistance, and adherence. The curable resin compositions are useful in forming protective films on electronic parts, typically semiconductor devices.

EXAMPLE

Examples of the present invention are given below by way of illustration and not by way of limitation. All parts are by weight.

EXAMPLES 1-6 and COMPARATIVE EXAMPLES 1-2

Curable resin composition varnishes were prepared using the compounds (I), (II) and solvent shown in Table 1. In some examples, co-condensation between compounds (I) and (II) was carried out to form co-condensates under the conditions shown in Table 1 in the presence of water.

Shelf stability was evaluated by measuring the viscosity of the compositions both at the initial and after storage at 5° C. for 6 months. The compositions were cured by heating at 25° C. for 2 hours, at 150° C. for 1 hour, and further at 350° C. for 1 hour. The cured films were examined for film state, hardness and adherence by the following test methods. The results are shown in Table 1.

Film state

A cured film of 5 μm thick was observed for the occurrence of cracks. A film with few or no cracks was rated Good and a cracked film was rated Poor.

Hardness

Pencil hardness was measured.

Adherence

An adhesive tape test was carried out by scribing a film on a silicon wafer and pulling adhesive tape for removing film sections. The number of retained film sections per 100 sections was counted.

TABLE 1

| | Composition (pbw) | | | Condensation | Shelf stability 6-month | Test | | |
|---|---|---|---|---|---|---|---|---|
| Compound (I)* | Compound (II) | Solvent | | H$_2$O Conditions | aging (cp)/ initial (cp) | Film state | Hardness | Adherence |

TABLE 1-continued

| | | | | | | | | | |
|---|---|---|---|---|---|---|---|---|---|
| E1 | A(20) | ⌬—Si(OCH$_3$)$_3$ (10) | diglyme (70) | — | — | 100/95 | Good | 5H | 100/100 |
| E2 | A(20) | ⌬—Si(OCH$_3$)$_3$ (20) | N-methyl-2-pyrrodidone (60) | — | — | 110/100 | Good | 5H | 100/100 |
| E3 | A(20) | ⌬—Si(OCH$_3$)$_3$ (20) | diglyme (60) | 0.2 | 5° C./48 hr. | 620/580 | Good | 5H | 100/100 |
| E4 | B(20) | CH$_3$Si(OCH$_3$)$_3$ (10) | diglyme (70) | 0.2 | 5° C./48 hr. | 210/180 | Good | 6H | 100/100 |
| E5 | B(20) | CH$_3$Si(OCH$_3$)$_3$ (5) ⌬—Si(OCH$_3$)$_3$ (15) | diglyme (60) | 0.4 | 5° C./48 hr. | 420/390 | Good | 5H | 100/100 |
| E6 | C(20) | Si(OC$_2$H$_5$)$_4$ (5) | diglyme (75) | 0.4 | 5° C./48 hr. | 725/710 | Good | 5H | 100/100 |
| CE1 | D(20) | ⌬—Si(OCH$_3$)$_3$ (10) | diglyme (70) | — | — | gelled/105 | Good | 5H | 100/100 |
| CE2 | D(20) | ⌬—Si(OCH$_3$)$_3$ (10) | diglyme (70) | 0.2 | 5° C./48 hr. | gelled during reaction | — | — | — |

*Compound (I)

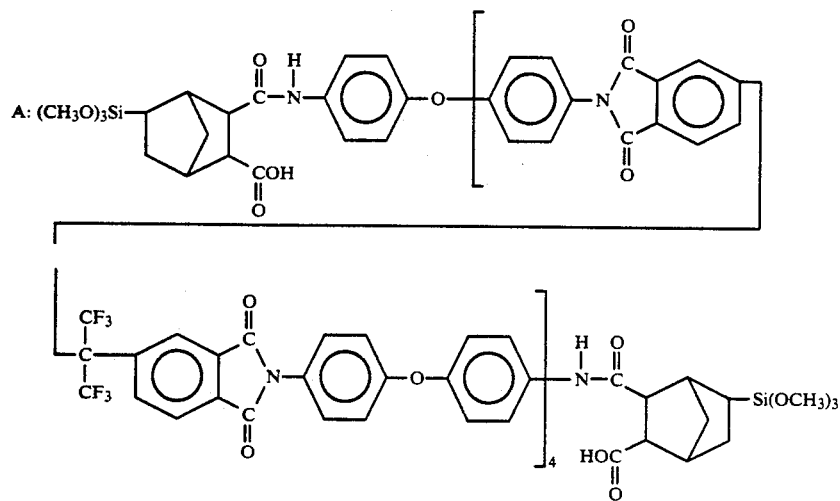

TABLE 1-continued
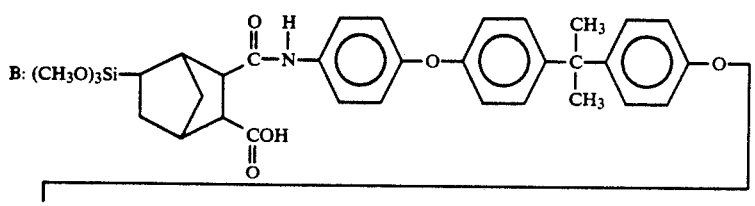
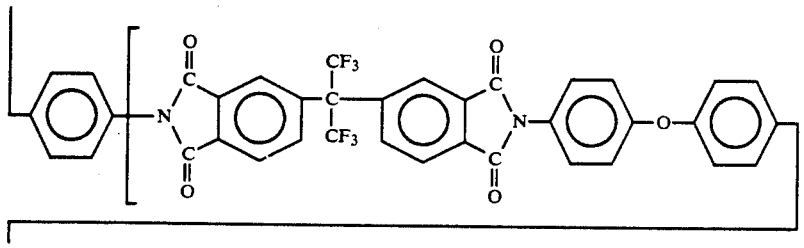
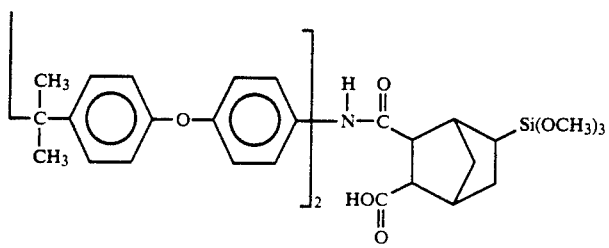
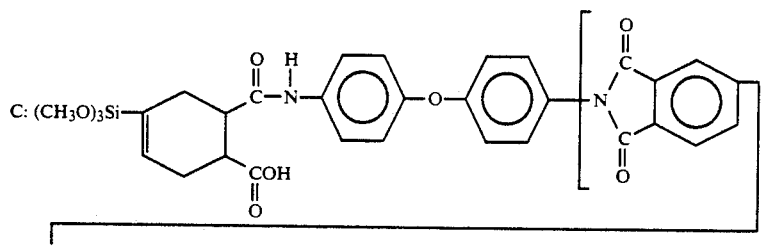
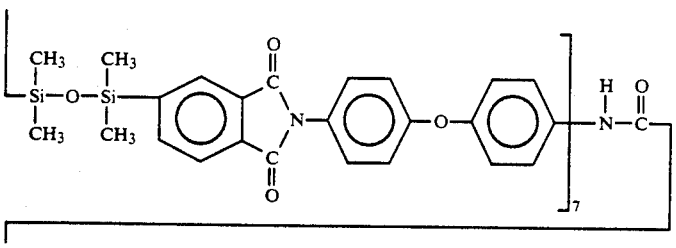
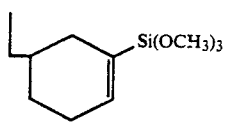
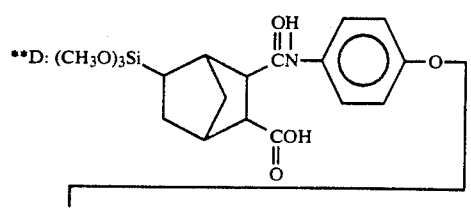

TABLE 1-continued

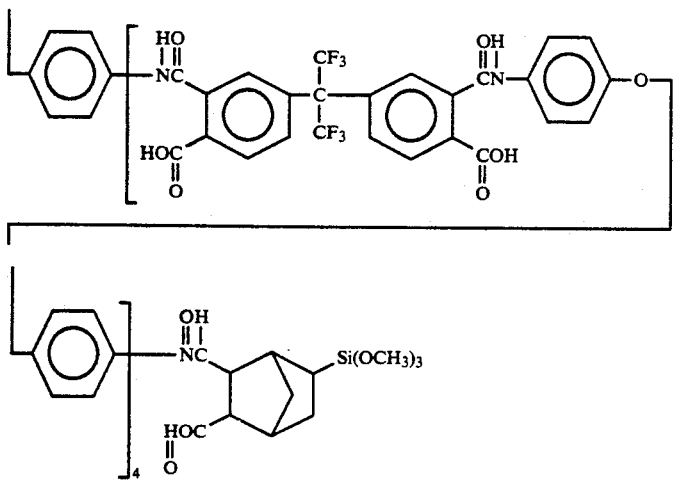

As seen from Table 1, the curable resin compositions having a compound of formula (I) and an organosilane or polysiloxane of formula (II) blended therein, Examples 1 to 6, were stable during shelf storage and their cured films had good state, high hardness and firm adhesion to substrates. The cured films of curable resin compositions of Examples 1 to 6 were also found improved in heat resistance, mechanical strength, electrical properties, and solvent resistance.

Although some preferred embodiments have been described, many modifications and variations may be made thereto in the light of the above teachings. It is therefore to be understood that within the scope of the appended claims, the invention may be practiced otherwise than as specifically described.

We claim:

1. A curable resin composition comprising a mixture or co-condensate of a compound of formula (I) and an organosilane or organopolysiloxane of formula (II), wherein said formula (I) compound is selected from the group consisting of structures (A), (B) and (C):

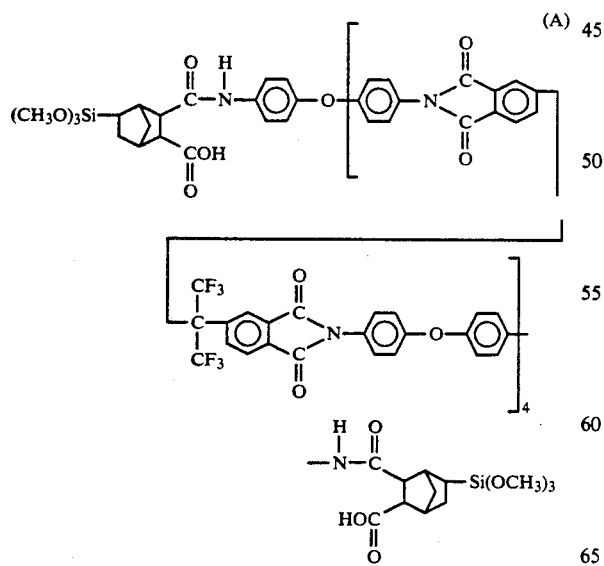

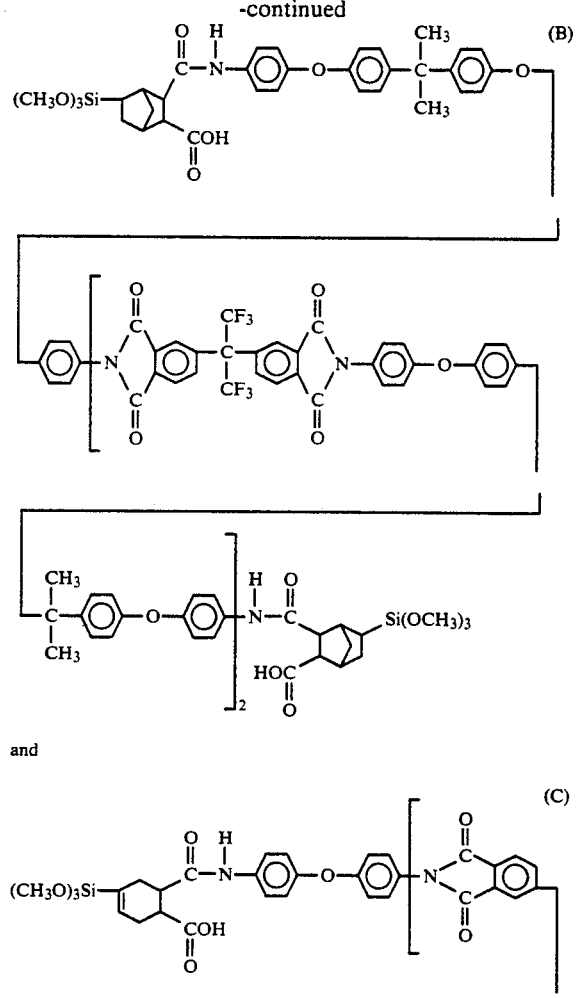

-continued

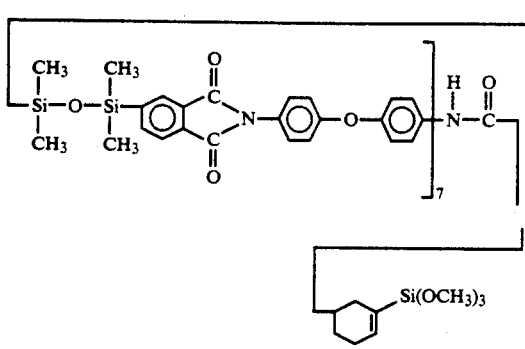

and said organosilane or organopolysiloxane is of the following molecular formula:

$$R^4{}_a(R^5O)_b SiO_{(4-a-b)/2} \qquad (II)$$

wherein $R^4$ and $R^5$ are independently selected from a hydrogen atom and substituted or unsubstituted monovalent hydrocarbon groups having 1 to 10 carbon atoms, letters a and b are numbers in the range: $0 \leq a \leq 3$, $0 < b \leq 4$, and $0 < a+b \leq 4$.

2. The curable resin composition of claim 1 wherein the the compound of formula (I) and the organosilane or organopolysiloxane of formula (II) are mixed in a weight ratio of from 10/1 to ½.

3. The resin composition of claim 1 wherein said formula (II) compound is selected from the group consisting of:

Si $(OCH_3)_4$, Si $(OC_2H_5)_4$, Si $(OC_3H_7)_4$, Si $(CH_3)(OCH_3)_3$, Si $(C_6H_5)(OCH_3)_3$, Si $(CH_3)(OC_2H_5)_3$, Si $(C_6H_5)(OC_2H_5)_3$, Si $(CH_3)_2(OCH_3)_2$, Si $(C_6H_5)_2(OCH_3)_2$, Si $(CH_3)_2(OC_2H_5)_2$, Si $(C_2H_5)_2(OH)_2$, Si $(C_6H_5)(OH)_2$, and

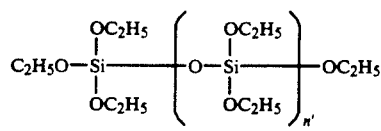

wherein n' is an integer of from 1 to 50, and mixtures thereof.

4. The resin composition of claim 1 wherein said formula (I) compound is (A) and said formula (II) compound is Si$(C_6H_5)(OCH_3)_3$.

5. The resin composition of claim 1 wherein said formula (I) compound is (B) and said formula (II) compound is Si$(CH_3)(OCH_3)_3$.

6. The resin composition of claim 1 wherein said formula (I) compound is (C) and said formula (II) compound is Si$(OC_2H_5)_4$.

7. A protective coating for electronic parts obtained by curing the composition in any one of claims 1, 2, 3, or 4 to 6.

* * * * *